United States Patent [19]
Miller, Jr.

[11] Patent Number: 5,296,652
[45] Date of Patent: Mar. 22, 1994

[54] APPARATUS FOR ATTACHING A CIRCUIT COMPONENT TO A PRINTED CIRCUIT BOARD

[75] Inventor: Grady A. Miller, Jr., Grand Prairie, Tex.

[73] Assignee: Loral Vought Systems Corporation, Grand Prairie, Tex.

[21] Appl. No.: 876,192

[22] Filed: Apr. 30, 1992

Related U.S. Application Data

[62] Division of Ser. No. 695,206, May 3, 1991.

[51] Int. Cl.$^5$ .............................................. H02B 1/00
[52] U.S. Cl. ................................. 174/265; 174/260; 174/262; 439/65; 361/730; 361/785
[58] Field of Search ............... 174/250, 260, 262, 264, 174/266, 265; 361/394, 400, 412, 414, 413; 29/842, 843; 439/66, 67, 71, 65

[56] References Cited

U.S. PATENT DOCUMENTS

| | | | |
|---|---|---|---|
| 4,885,662 | 12/1989 | Bartholomew et al. | 361/413 X |
| 5,049,084 | 9/1991 | Bakke | 439/66 |
| 5,061,989 | 10/1991 | Yen et al. | 361/413 X |

*Primary Examiner*—Leo P. Picard
*Assistant Examiner*—L. Thomas
*Attorney, Agent, or Firm*—Arnold, White & Durkee

[57] ABSTRACT

A method and apparatus are provided for mounting a circuit component such as a gate array device 12 on a printed circuit board 14. The component 12 may include a plurality of pin-type electrical contacts 18 wherein a first portion of the pin-type contacts 18 have been replaced by button-type contacts. In one embodiment, at least two of the pin-type contacts 22, 24 have been retained and serve the dual purpose of locating the gate array device 12 on the printed circuit board 14 and attaching the gate array device 12 to the printed circuit board 14. A sheet of boron nitride 26 is positioned between the printed circuit board 14 and the circuit component, e.g., the gate array device 12. The sheet of boron nitride 26 includes a plurality of openings extending therethrough in a pattern corresponding to the pattern of electrical contacts 18 on the gate array device 12. The openings 32 in the sheet of boron nitride 26 that correspond to the button-type contacts have resilient electrical contacts 34 disposed therein. The printed circuit board 14 includes a plurality of pad-type contacts 40 disposed on a surface thereof in a pattern corresponding to the button-type contacts of the gate array device 12.

17 Claims, 2 Drawing Sheets

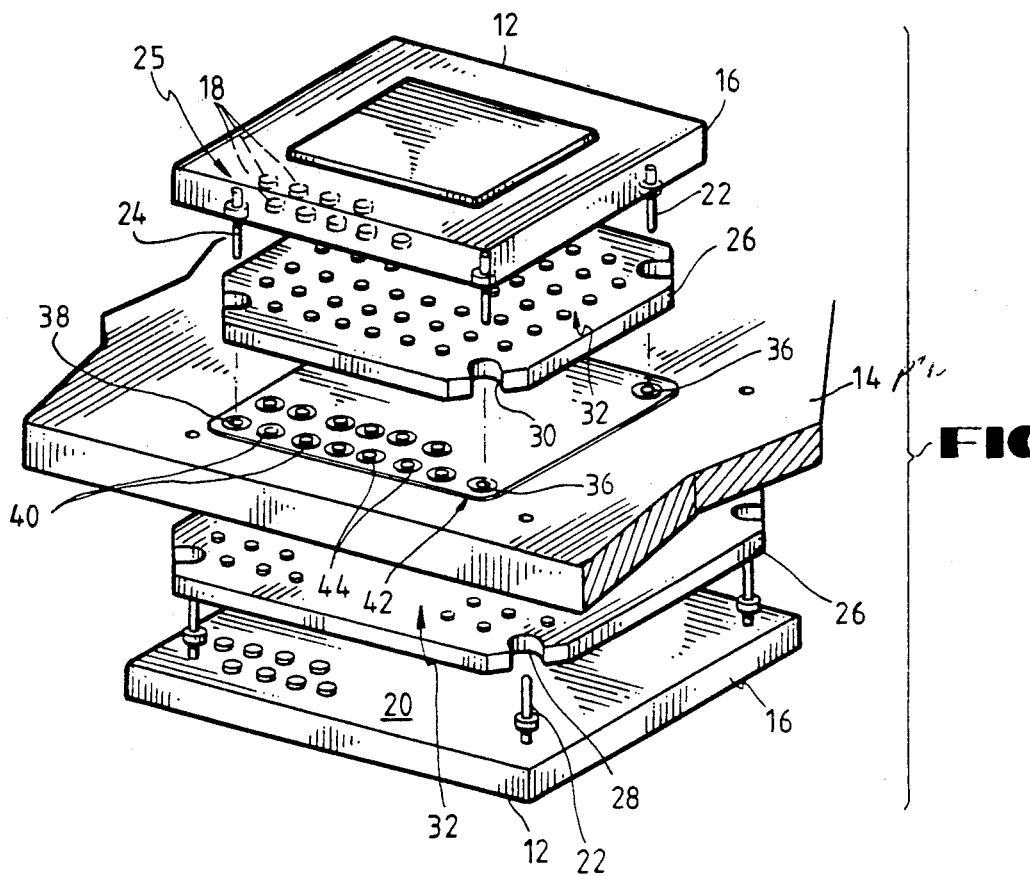
FIG.1
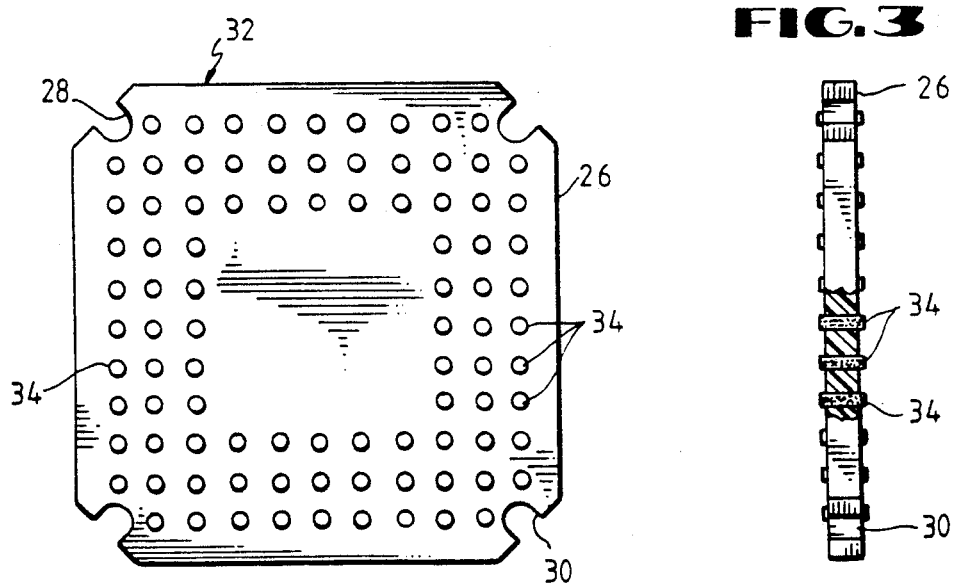
FIG.3
FIG.2

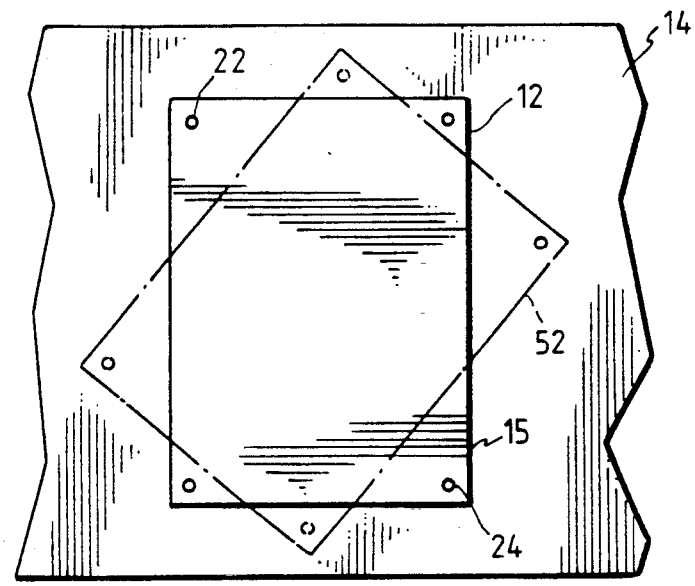
FIG.6
FIG.5
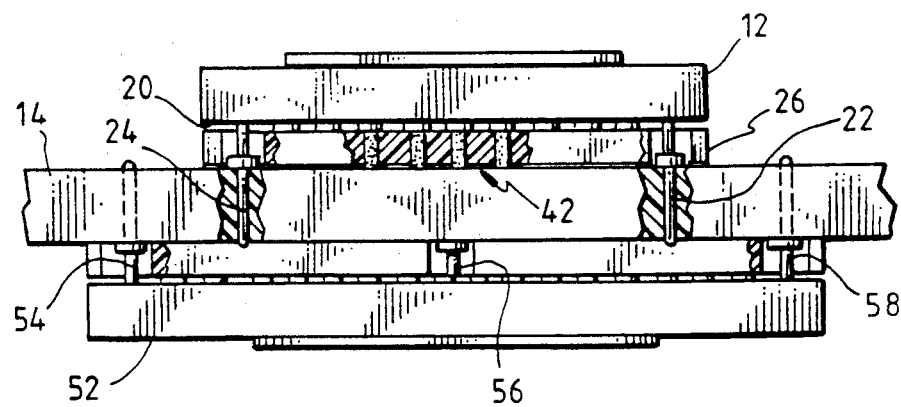
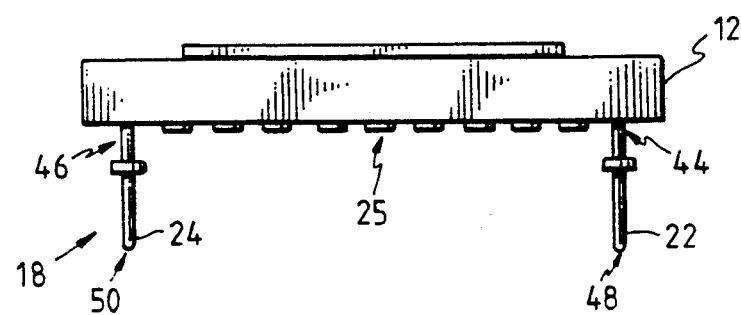
FIG.4

APPARATUS FOR ATTACHING A CIRCUIT COMPONENT TO A PRINTED CIRCUIT BOARD

This application is a divisional of application Ser. No. 07/695,206, filed May 3, 1991.

BACKGROUND OF THE INVENTION

1. Technical Field

This invention relates generally to a method and apparatus for attaching a circuit component to a printed circuit board and, in particular, to a method and apparatus for quickly and reliably attaching a component, such as a gate array device, that may have a relatively large number of pin-type contacts to a printed circuit board.

2. Description of the Related Art

When first developed, components such as integrated circuits were relatively simple devices with few input/output requirements. Thus, packaging was generally accomplished by such simple configurations as dual in-line packages with, for example, only fourteen pin-type contacts extending therefrom. However, with the development of increasingly sophisticated electronic circuits and, correspondingly, higher component density integrated circuits, the physical packaging of integrated circuits advanced to larger dual in-line packages with increased numbers of pin-type contacts disposed about the periphery of the package.

More recently, integrated circuits have attained a sophistication and density that requires more pin-type contacts than can reasonably be distributed about the periphery of an integrated circuit. Accordingly, gate array devices have been developed that can have 160 or more pin-type contacts. Typically, gate array devices have their pin-type contacts arranged in a generally rectangular pattern extending from a rear or mounting surface of the integrated circuit. These pin-type contacts are mated with corresponding plated-through openings on a printed circuit board and soldered into place.

It should be appreciated that manually soldering such a large number of pin-type contacts is a time consuming process, readily subject to errors and/or unacceptable joints. Standard, automated wave soldering techniques or solder preform techniques are readily applicable to gate array devices, but are typically available only for production printed circuit boards. That is to say, during the development of a printed circuit board, production techniques are typically not used, since the development-type printed circuit board is subject to numerous design changes. Rather, during development, it is preferable that the printed circuit board be readily alterable, such as, by removing and replacing electrical devices which may be socket mounted thereon.

Therefore, it is desirable that a method and apparatus be developed to accurately and quickly mount components such as gate array devices on printed circuit boards while minimizing time consuming manual tasks. Further, it is preferable that this technique also be readily utilized in production-type environments.

Additionally, the increased component density of integrated circuits has resulted in the need for a greater magnitude of heat being dissipated from the integrated circuit. Typical dual in-line packages have their lower or mounting surface free for intimate mating with a heat sink. Thus, heat is readily dissipated through the mounting surface and into an appropriately sized heat sink. However, components such as gate array devices have their mounting surface substantially occupied by pin-type contacts and cannot simply be mounted on a conventional, electrically conductive heat sink.

The present invention is directed to overcoming or minimizing one or more of the problems discussed above.

SUMMARY OF THE INVENTION

In one aspect of the present invention, a method is provided for mounting a component such as a gate array device having a plurality of contacts on a printed circuit board. The method includes replacing a first portion of the pin-type contacts on the gate array device with button-type contacts and retaining a second portion of the pin-type contacts. Alternatively, the component may be formed initially with button-type contacts rather than pin-type contacts, or a combination of the two types. A plurality of copper contacts are positioned on a surface of the printed circuit board in locations corresponding to the button-type contacts of the gate array device. A plurality of openings are formed in the printed circuit board in positions corresponding to the second portion of the pin-type contacts of the gate array device. A plurality of resilient electrical contacts are imbedded in a sheet of electrically insulative and thermally conductive material in positions corresponding to the location of the button type contacts of the gate array device and the printed circuit board. Further, a plurality of openings are formed in the sheet of material in positions corresponding to the location of the second portion of the pin-type contacts and the openings in the printed circuit board. Thus, inserting the sheet of material between the gate array device and the printed circuit board results in the second portion of the pin-type contacts extending through the openings in the sheet of material and the printed circuit board and the resilient electrical contacts being in electrical communication with the corresponding button-type contacts on the printed circuit board and the gate array device. Finally, the second portion of the pin-type contacts are attached to the printed circuit board.

In another aspect of the present invention, an apparatus is provided for mounting a component such as a gate array device on a printed circuit board. The gate array device has a plurality of electrical contacts, wherein a first portion of the electrical contacts are button-type contacts, and, in one embodiment, a second portion of the electrical contacts are pin-type contacts. A printed circuit board has a plurality of electrical contacts mounted thereon, wherein a first portion of the printed circuit board electrical contacts are button-type contacts arranged in a configuration corresponding to the gate array device button type-contacts, and a second portion of the printed circuit board electrical contacts are plated-through, opening-type contacts arranged in a configuration corresponding to the gate array device pin-type contacts. A sheet of electrically insulative and thermally conductive material is positioned between the printed circuit board and the gate array device and has a plurality of resilient electrical contacts extending therethrough and arranged in a configuration corresponding to the button-type contacts of the gate array device and the printed circuit board. The sheet of material also has a plurality of openings extending therethrough in positions corresponding to the location of the pin-type contacts and the opening-type contacts in the printed circuit board, whereby each of the gate array device electrical contacts is in electrical communication with each of the corresponding printed circuit board electrical contacts. Finally, the gate array device is retained on the printed circuit board and urged toward the printed circuit board with sufficient force to compress the sheet of material into substantial thermal contact with the gate array device.

BRIEF DESCRIPTION OF THE DRAWINGS

Other objects and advantages of the invention will become apparent upon reading the following detailed description and upon reference to the drawings in which:

FIG. 1 illustrates an exploded perspective view of a gate array device, a sheet of boron nitride, and a printed circuit board;

FIG. 2 illustrates an end view of a sheet of boron nitride with a plurality of resilient electrical contacts embedded therein;

FIG. 3 illustrates a partial, cross sectional side view of the sheet of boron nitride with the resilient electrical contacts embedded therein;

FIG. 4 illustrates a side view of a gate array device;

FIG. 5 illustrates a side view of the gate array device, the sheet of boron nitride, and the printed circuit board assembled as a unitary structure; and FIG. 6 illustrates an alternative mounting arrangement for a dual-sided printed circuit board.

While the invention is susceptible to various modifications and alternative forms, specific embodiments thereof have been shown by way of example in the drawings and will herein be described in detail. It should be understood, however, that this specification is not intended to limit the invention to the particular forms disclosed herein, but on the contrary, the intention is to cover all modifications, equivalents, and alternatives falling within the spirit and scope of the invention, as defined by the appended claims.

DESCRIPTION OF A PREFERRED EMBODIMENT

Referring now to the drawings and, in particular, to FIG. 1, an exploded perspective view of an apparatus 10 for mounting a component such as a gate array device 12 on a printed circuit board 14 is shown. The printed circuit board 14 is of a conventional construction and can take the form of a relatively simple single-sided printed circuit board, a dual-sided printed circuit board, or even a multilevel printed circuit board.

The gate array device 12 is also of a conventional configuration, consisting of an integrated circuit contained in, for example, a plastic or ceramic housing 16 with a plurality of electrical contacts 18 extending from the housing 16 on a rear or mounting surface 20. The electrical contacts 18 are typically arranged in a rectangular configuration covering much of the rear surface 20 of the gate array device 12. Typically, manufacturers provide each gate array device with a series of pin-type contacts 22, 24, such as those illustrated at diametrically opposed corners of the rear surface 20. Ordinarily, all of the electrical contacts 18 are of the pin-type construction. Here, a first portion of the pin-type contacts 25 have been replaced by button-type contacts, while a second portion of the electrical contacts 18 remain as pin-type contacts 22, 24. As was suggested above, the gate array device 12 or other such component may be initially provided with appropriate button-type contacts rather than pin-type contacts. As is explained more fully below, the pin-type contacts 22, 24 (or other contact devices) serve the dual function of polarizing the gate array device 12 in its proper orientation and affixing the gate array device 12 to the printed circuit board 14.

A sheet of electrically insulative and thermally conductive material 26 is disposed between the gate array device 12 and the printed circuit board 14. The sheet of material 26 serves the dual purpose of providing electrical contact between the button-type contacts of the gate array device 12 and the printed circuit board 14 and dissipating heat generated in the gate array device 12. To provide both of these desirable properties, the sheet of material 26 is preferably constructed from boron nitride. Boron nitride is both electrically insulative and a good conductor of thermal energy.

The sheet of material 26 is of generally the same size and shape as the gate array device 12 and is formed by cutting or punching a plurality of openings therethrough in a pattern corresponding to the electrical contacts 18 of the gate array device 12. The pin-type contacts 22, 24 readily extend through corresponding openings 28, 30. The remaining openings 32 are filled with imbedded resilient electrical contacts 34. Preferably, the resilient electrical contacts 34 take the form of "fuzz buttons TM."

A "fuzz button TM" is basically a specific length of wire compressed into a loose, springy cylindrical shape. A typical "fuzz button TM" may, for example, be constructed from 0.002 inch diameter wire which is compressed into a cylinder of 0.050 inch diameter by 0.050 inch height with a typical deflection of about 10–15%.

The sheet of material 26 is sufficiently resilient such that it is readily deformable, but has a tendency to return to its original configuration. Thus, the holes 32 are preferably formed having a diameter slightly less than the diameter of the resilient electrical contacts 34. Therefore, when the resilient electrical contacts 34 are forced through the openings 32, the sheet of material 26 has a tendency to deform and allow the electrical contacts 34 to press therein, but the sheet of material 26 tends to return to its original configuration, causing a force to be applied to the resilient electrical contacts 34 and thereby retain the electrical contacts 34 within the sheet of material 26.

The printed circuit board 14 has a pair of plated-through, opening-type contacts 36, 38 positioned so as to correspond to the pin-type contacts 22, 24 of the gate array device 12 and the openings 28, 30 in the sheet of material 26. Preferably, the pin-type contacts 22, 24 are inserted through the openings 28, 30 and into the plated-through, opening-type contacts 36, 38 where they are retained by, for example, soldering. As is conventional in the art of printed circuit board design, the plated-through, opening-type contacts 36, 38 preferably have copper tracks (not shown) Which ultimately connect the pin-type contacts 22, 24 and the plated-through, opening-type contacts 36, 38 to their desired location and components positioned on the printed circuit board 14.

The printed circuit board 14 also includes a plurality of contact regions or pad-type contacts 40, which are formed, for example, by deposition of a layer of copper and attendant etching away of undeseriable portions of the copper layer. The pad-type contacts 40 are mounted on a surface of the printed circuit board 14 in positions corresponding to the button-type contacts of the gate array device 12. In this manner, it should be readily appreciated that the button-type contacts of the gate array device 12 are in electrical communication with the pad-type contacts 40 of the printed circuit board 14 via the resilient electrical contacts 34 in the sheet of material 26. The printed circuit board 14 also has copper tracks (not shown) connecting each of the pad-type contacts 40 to the desired location and components on the printed circuit board 14.

Referring now to FIG. 2, an end view of the sheet of material 26 is illustrated. The sheet of material 26 is shown with selected corners removed therefrom. In particular, the corners corresponding to openings 28, 30 have been removed on a line intersecting the centerpoint of the openings 28, 30 so that at least a portion of the pin-type contacts 22, 24 are exposed and readily accessible for soldering.

The resilient electrical contacts 34 are best illustrated in the partial cross sectional view of FIG. 3. The resilient electrical contacts 34 extend through the sheet of material 26 and have an uncompressed length slightly greater than the thickness of the sheet of material 26. In this manner, the resilient electrical contacts 34 extend slightly above the surface of the sheet of material 26 and are free to contact the button-type contacts of the gate array device 12 and the printed circuit board 14.

When the gate array device 12 is mounted on the printed circuit board 14, a force is applied to the printed circuit board 14 and/or the gate array device 12 so that they are urged together with sufficient force to compress the resilient electrical contacts 34, as well as the sheet of material 26. The resilient electrical contacts 34 compensate for any variations in height of the button-type contacts of the gate array device 12 and the printed circuit board 14. Forcing the gate array device 12 toward the printed circuit board 14 helps ensure that the resilient electrical contacts 34 are compressed and good electrical and thermal connection is achieved.

Further, compression of the sheet of material 26 ensures substantial contact between the material 26, the printed circuit board 14, and the gate array device 12. Thus, the excellent thermal conductivity of the sheet of boron nitride 26 helps ensure that a substantial portion of the heat generated by the gate array device 12 is dissipated through the sheet of boron nitride 26 and into the printed circuit board 14 and the air surrounding the gate array device 12, as well as the electrical contacts 34.

Heat dissipation from the gate array device 12 into the printed circuit board 14 is further enhanced by a layer of copper 42 disposed on a surface of the printed circuit board 14. The layer of copper 42 underlies the region on which the gate array device 12 and the sheet of boron nitride 26 is placed on the circuit board 14. Copper is, of course, a good thermal conductor. However, copper is also a good electrical conductor. Therefore, to prevent shorting of the pad-type electrical contacts 40 on the printed circuit board 14, the layer of copper 42 is etched away from a circular region 44 surrounding each of the pad-type contacts 40. Thus, when the gate array device 12 is urged toward the printed circuit board 14, the sheet of boron nitride deforms and comes into substantial contact with both the rear surface 20 of the gate array device 12 and the layer of copper 42, providing a direct thermal path between the gate array device 12 and the printed circuit board 14 and into the electronic chassis at printed circuit board heat sink mounting points.

To help ensure that the sheet of boron nitride 26 remains in substantial contact with both the gate array device 12 and the printed circuit board 14, the pin-type contacts 22, 24 are soldered to the plated-through, opening-type contacts 36, 38 while the force is still applied to the gate array device 12. Once the solder solidifies, the sheet of boron nitride 26 remains compressed between the gate array device 12 and the printed circuit board 14 independent of a force being applied to the gate array device 12 or the printed circuit board 14.

Referring now to FIG. 4, an alternative embodiment of the pin-type contacts 22, 24 on the gate array device 12 is illustrated. The majority of the pin-type contacts 18 have been replaced by button-type contacts 25, or, alternatively, the gate array device 12 may be originally fabricated with the illustrated arrangement of button and pin-type contacts. The pin-type contacts 22, 24 aid in locating and mounting the gate array device 12. However, to help ensure proper positioning of the gate array device at a preselected distance from the printed circuit board 14, the pin-type contacts 22, 24 are modified from the pin-type contacts 22, 24 illustrated and discussed in conjunction with FIGS. 1 and 4.

Each of the pin-type contacts 22, 24 in FIG. 4 has a first end portion 44, 46 connected to the gate array device 12. Each of the pin-type contacts 22, 24 also has a second end portion 48, 50 spaced from the gate array device 12. Further, each of the second end portions 48, 50 is divided into a proximal section adjacent the first end portions 44, 46 and a distal section spaced from the first end portions 44, 46. Each of the distal sections has a first preselected diameter adapted for being received in one of the plated-through, opening-type contacts 36, 38 of the printed circuit board 14. Each of the proximal sections has a second preselected diameter adapted for contacting the surface of the printed circuit board 14 and spacing the gate array device 12 a preselected distance from the printed circuit board 14. In other words, the junction of the proximal and distal sections forms a shoulder that has a diameter greater than the diameter of the plated-through, opening-type contacts 36, 38.

Thus, applying a force to the gate array device 12, urges the gate array device 12 toward the printed circuit board 14, compressing the sheet of boron nitride 26 until the proximal section of the pin-type contacts 22, 24 contacts the surface of the printed circuit board 14. These shoulders provide uniform spacing of the gate array device 12 relative to the printed circuit board 14 and prevent over-stressing the resilient electrical contacts 34 and the sheet of boron nitride 26. In an alternative embodiment, not shown, the circuit component 12 and printed circuit board 14 are constrained in contact with the sheet of boron nitride 26 by other fastening means such as screws, clamps, spring-loaded housings, or the like, without the use of pin-type contacts, such as pin-type contacts 22, 24.

Referring now to FIG. 5, an end view of the gate array device 12 mounted on the printed circuit board 14 is illustrated. In this embodiment, the printed circuit board 14 is of the dual-sided variety. The gate array device 12 is shown fully inserted into the printed circuit board 14 with the sheet of boron nitride 26 properly compressed between the rear surface 20 and the layer of copper 42. Likewise, a second gate array device 52 is shown mounted directly opposite the gate array device 12. The second gate array device 52 is substantially larger than the first gate array device 12 Thus, it is desirable that more than two pin-type contacts be used to stabilize the gate array device 52 during the soldering process. Thus, three pin-type contacts 54, 56, 58 are shown extending from a rear surface 60 of the gate array device 52 and through the printed circuit board 14. Some care must be taken in locating the pin-type contacts 54, 56, 58 to avoid interference with the first gate array device 12 located on the opposite side of the printed circuit board 14. As can be seen from the drawing, the pin-type contacts typically extend entirely through the printed circuit board 14 in such a manner that they can interfere with the button-type contacts or pin-type contacts of the oppositely positioned gate array device.

An alternative mounting arrangement for avoiding interference between oppositely positioned gate array devices is illustrated in FIG. 6. The oppositely positioned gate array devices 12, 52 are rotated relative to one another through an angle of up to 90, and approximately 45° being shown in the drawing. Thus, even where each of the gate array devices 12, 52 utilizes four pin-type contacts located at their respective corners, none of the pin-type contacts extend through the printed circuit board 14 into a region that is occupied by contacts of the oppositely positioned gate array device. In fact, none of the corners of either of the gate array devices 12, 52 overlap with any portion of the oppositely positioned gate array device.

I claim:

1. A printed circuit board assembly, comprising:
   an integrated circuit package having a plurality of button-type electrical contacts;
   a printed circuit board having a plurality of contact regions formed thereon and arranged in a configuration corresponding to a portion of said integrated circuit package button type-contacts;
   a sheet of electrically insulative and thermally conductive material positioned between said printed circuit board and said integrated circuit package and having a plurality of resilient electrical contacts extending therethrough and arranged in a configuration corresponding to a portion of the button-type contacts of said integrated circuit package and said contact regions of said printed circuit board whereby at least a portion of said integrated circuit package button-type contacts are in electrical communication with said corresponding printed circuit board contact regions; and
   means for retaining said integrated circuit package on said printed circuit board and urging said integrated circuit package and said printed circuit board together with sufficient force to compress said sheet of material into substantial thermal contact with said integrated circuit package.

2. An apparatus, as set forth in claim 1, wherein said means for retaining includes means for mechanically affixing said integrated circuit package to said printed circuit board.

3. An apparatus set forth in claim 1, wherein said sheet of material is formed from boron nitride.

4. An apparatus, as set forth in claim 1, wherein a portion of said printed circuit board contact regions include button-type contacts mounted on said printed circuit board.

5. An apparatus, as set forth in claim 4, wherein said printed circuit board includes a layer of copper disposed on the surface thereof extending about said button-type contacts and electrically isolated from said button-type contacts, said layer of copper being positioned immediately adjacent said sheet of material and being adapted for thermal transfer therethrough.

6. A printed circuit board assembly, comprising:
   a gate array device having a plurality of electrical contacts, a first portion of said electrical contacts being button-type contacts, and a second portion of said electrical contacts being pin-type contacts;
   a printed circuit board having a plurality of electrical contacts mounted thereon, a first portion of said printed circuit board electrical contacts being button-type contacts arranged in a configuration corresponding to said gate array device button type-contacts, and a second portion of said printed circuit board electrical contacts being plated-through, opening-type contacts arranged in a configuration corresponding to said gate array device pin-type contacts;
   a sheet of electrically insulative and thermally conductive material positioned between said printed circuit board and said gate array device and having a plurality of resilient electrical contacts extending therethrough and arranged in a configuration corresponding to the button-type contacts of said gate array device and said printed circuit board, said sheet of material defining a plurality of openings extending therethrough in positions corresponding to the location of said pin-type contacts and said opening-type contacts in said printed circuit board whereby each of said gate array device electrical contacts is in electrical communication with each of said corresponding printed circuit board electrical contacts; and
   means for retaining said gate array device on said printed circuit board and urging said gate array device and said printed circuit board together with sufficient force to compress said sheet of material into substantial contact with said gate array device.

7. A printed circuit board assembly, as set forth in claim 6 wherein said means for retaining includes said pin-type contacts being soldered to said plated-through, opening-type contacts.

8. A printed circuit board assembly, as set forth in claim 6, wherein the second portion of said electrical contacts includes at least two pin-type contacts located adjacent an outer edge of said gate array device.

9. A printed circuit board assembly, as set forth in claim 6 wherein said electrical contacts are arranged on said gate array device in a generally rectangular configuration and the second portion of said electrical contacts includes at least two pin-type contacts located at diametrically opposed corners of said rectangular configuration.

10. A printed circuit board assembly, as set forth in claim 9, wherein said sheet of material is generally rectangular in configuration with selected corners removed therefrom, said selected corners being removed along a line intersecting the openings that correspond to said diametrically opposed pin-type contacts whereby at least a portion of each of the diametrically opposed pin-type contacts is exposed.

11. A printed circuit board assembly, as set forth in claim 6, wherein said sheet of material is formed from boron nitride.

12. A printed circuit board assembly, as set forth in claim 6, wherein each of said pin-type contacts has a first end portion connected to said gate array device and a second end portion spaced from said gate array device, said second end portion having a proximal section adjacent said first end portion and a distal section spaced from said first end portion, said distal section of said second end portion having a first preselected diameter adapted for being received in one of said plated-through, opening-type contacts of said printed circuit board, said proximal section of said second end portion having a second preselected diameter adapted for contacting the surface of said printed circuit board and spacing said gate array device a preselected distance from said printed circuit board.

13. A printed circuit board assembly, as set forth in claim 6, wherein said printed circuit board includes a layer of copper disposed on the surface thereof extending about said plurality of electrical contacts and electrically isolated from said plurality of electrical contacts, said layer of copper being positioned immediately adjacent said sheet of material and being adapted for thermal transfer therethrough.

14. A printed circuit board assembly, comprising:
(a) a printed circuit board having first and second sides;
(b) an array of button-type contacts mounted on the first side of the board;
(c) a gate array device having a matching array of button-type contacts adapted to be mounted on the board such that the two arrays of button-type contacts are in alignment;
(d) a thermally conductive electrically insulating layer adapted to be interposed between the two arrays of button-type contacts, said layer including an array of channels capable of enabling electrical connections between the two arrays of button-type contacts upon assembly of the board, the gate array device and the interposed insulating layer; and
(e) a resiliently compressible member associated with each matching pair of said button-type contacts effective upon such assembly to enable said two arrays of button-type contacts to contact each other in a resiliently compressible relation.

15. The assembly of claim 14 which further comprises a plurality of pin-type contacts mounted on the gate array device, a plurality of receptacles on the circuit board positioned to receive the pin-type contacts in rigid relation upon such assembly, and a plurality of passageways in the insulating layer positioned to enable the pin-type contacts to pass through the insulating layer for reception by the receptacles.

16. The assembly of claim 15 wherein the pin-type contacts are metallic electrical contacts, and the receptacles are plated-through, opening-type electrical contacts.

17. The assembly of claim 16 wherein the pin-type contacts and receptacles are rigidly soldered together following such assembly.

* * * * *